US012628646B2

(12) United States Patent
Terasaki

(10) Patent No.: US 12,628,646 B2
(45) Date of Patent: May 12, 2026

(54) COPPER/CERAMIC ASSEMBLY AND INSULATING CIRCUIT SUBSTRATE

(71) Applicant: MITSUBISHI MATERIALS CORPORATION, Tokyo (JP)

(72) Inventor: Nobuyuki Terasaki, Saitama (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 381 days.

(21) Appl. No.: 18/559,155

(22) PCT Filed: Jul. 15, 2022

(86) PCT No.: PCT/JP2022/027855
§ 371 (c)(1),
(2) Date: Nov. 6, 2023

(87) PCT Pub. No.: WO2023/286857
PCT Pub. Date: Jan. 19, 2023

(65) Prior Publication Data
US 2024/0234242 A1      Jul. 11, 2024

(30) Foreign Application Priority Data
Jul. 16, 2021      (JP) ................................. 2021-117950

(51) Int. Cl.
*B32B 15/04*      (2006.01)
*B32B 17/06*      (2006.01)
(Continued)

(52) U.S. Cl.
CPC ......... *H10W 40/255* (2026.01); *H10W 70/05* (2026.01); *H10W 72/352* (2026.01); *H10W 90/734* (2026.01)

(58) Field of Classification Search
CPC ........... H10W 40/255; C04B 2237/127; C04B 2237/60
(Continued)

(56) References Cited

U.S. PATENT DOCUMENTS 11,028,022 B2 *   6/2021   Terasaki ................ C04B 35/645
11,638,350 B2 *   4/2023   Terasaki ............... H05K 1/0306
174/258
(Continued)

FOREIGN PATENT DOCUMENTS

CN      109417056 A      3/2019
CN      111225890 A      6/2020
(Continued)

OTHER PUBLICATIONS

Notice of Allowance mailed Aug. 22, 2025, issued for CN202280041666.4 and English translation thereof.
(Continued)

*Primary Examiner* — Lauren R Colgan
(74) *Attorney, Agent, or Firm* — Troutman Pepper Locke LLP

(57) ABSTRACT

This copper/ceramic assembly includes: a copper member consisting of copper or a copper alloy; and a ceramic member consisting of silicon nitride, wherein the copper member and the ceramic member are bonded. At a bonded interface between the ceramic member and the copper member, an active metal nitride layer is formed on a side of the ceramic member. In a region extending by 10 μm from the active metal nitride layer toward a side of the copper member, an area rate of an active metal compound containing Si and an active metal is 10% or less. A ratio $P_A/P_B$ of an area rate $P_A$ of the active metal compound in a peripheral part region of the copper member to an area rate $P_B$ of the
(Continued)

active metal compound in a central part region of the copper member is in a range of 0.7 or more and 1.4 or less.

8 Claims, 5 Drawing Sheets

(51) Int. Cl.
| | |
|---|---|
| *H10W 40/25* | (2026.01) |
| *H10W 70/05* | (2026.01) |
| *H10W 72/30* | (2026.01) |
| *H10W 90/00* | (2026.01) |

(58) Field of Classification Search
USPC .......................................................... 428/698
See application file for complete search history.

(56) References Cited

U.S. PATENT DOCUMENTS

| | | | | |
|---|---|---|---|---|
| 2015/0208496 A1* | 7/2015 | Terasaki | ................. | B23K 35/30 |
| | | | | 165/185 |
| 2016/0358791 A1* | 12/2016 | Terasaki | ................. | C04B 37/025 |
| 2019/0135706 A1* | 5/2019 | Terasaki | ................. | C04B 35/645 |
| 2020/0321264 A1* | 10/2020 | Terasaki | ................. | H05K 3/4644 |
| 2022/0102240 A1* | 3/2022 | Ebigase | ................. | C04B 37/026 |
| 2022/0285238 A1* | 9/2022 | Ebigase | ................. | B23K 1/00 |

FOREIGN PATENT DOCUMENTS

| | | | |
|---|---|---|---|
| JP | 3211856 | B2 | 9/2001 |
| JP | 2004-231513 | A | 8/2004 |
| JP | 2008-024561 | A | 2/2008 |
| JP | 2012-136378 | A | 7/2012 |
| JP | 2013-211546 | A | 10/2013 |
| JP | 2016-184606 | A | 10/2016 |
| JP | 2018-008869 | A | 1/2018 |
| JP | 2021-100896 | A | 7/2021 |
| WO | 2018/003845 | A1 | 1/2018 |
| WO | 2019/088222 | A1 | 5/2019 |
| WO | 2020/203787 | A1 | 10/2020 |
| WO | 2021/015122 | A1 | 1/2021 |
| WO | 2021/124923 | A1 | 6/2021 |

OTHER PUBLICATIONS

International Search Report mailed Aug. 30, 2022, issued for PCT/JP2022/027855 and English translation thereof.
Office Action mailed Jun. 16, 2025, issued for CN202280041666.4 and English translation of the Search Report.

* cited by examiner

COPPER/CERAMIC ASSEMBLY AND INSULATING CIRCUIT SUBSTRATE

TECHNICAL FIELD

The present invention relates to: a copper/ceramic assembly obtained by bonding a copper member consisting of copper or a copper alloy to a ceramic member; and an insulating circuit substrate obtained by bonding a copper sheet consisting of copper or a copper alloy to a surface of a ceramic substrate.

The present application claims priority on Japanese Patent Application No. 2021-117950 filed on Jul. 16, 2021, the content of which is incorporated herein by reference.

BACKGROUND ART

A power module, an LED module, and a thermoelectric module have a structure in which a power semiconductor element, an LED element, and a thermoelectric element are bonded to an insulating circuit substrate, and in the insulating circuit substrate, a circuit layer consisting of a conductive material is formed on one surface of an insulating layer.

For example, a power semiconductor element for high power control, which is used for controlling a wind power generation, an electric vehicle, a hybrid vehicle, or the like, generates a large amount of heat during operation, and thus, an insulating circuit substrate has been widely used in the related art as a substrate on which the power semiconductor element is mounted, and the insulating circuit substrate includes: a ceramic substrate; a circuit layer formed by bonding a metal sheet having excellent electrical conductivity to one surface of the ceramic substrate; and a metal layer for heat radiation, which is formed by bonding a metal sheet to the other surface of the ceramic substrate.

For example, Patent Document 1 proposes an insulating circuit substrate in which a circuit layer and a metal layer are formed by bonding a copper sheet to each of one surface and the other surface of a ceramic substrate. In Patent Document 1, the copper sheet is disposed on each of the one surface and the other surface of the ceramic substrate with an Ag—Cu—Ti-based brazing material being interposed, and then a heating treatment is carried out to bond the copper sheet (so-called active metal brazing method).

In addition, Patent Document 2 proposes a power module substrate in which a copper sheet consisting of copper or a copper alloy is bonded to a ceramic substrate consisting of silicon nitride by using a bonding material containing Ag and Ti.

As described above, in a case of bonding a copper sheet to a ceramic substrate using a bonding material containing Ti, Ti which is an active metal reacts with the ceramic substrate; and thereby, the wettability of the bonding material is improved, and the bonding strength between the copper sheet and the ceramic substrate is improved.

By the way, in recent years, there is a tendency that a heat generation temperature of a semiconductor element mounted on an insulating circuit substrate increases, and an insulating circuit substrate is required to have a thermal cycle reliability that can withstand a thermal cycle more severe than a thermal cycle in the related art.

In a case of bonding a copper sheet to a ceramic substrate using a bonding material containing Ti, as described above, there is a risk that Ti which is an active metal diffuses to the copper sheet side, and an intermetallic compound containing Cu and Ti is precipitated; and thereby, a portion in a vicinity of the bonded interface becomes hard, breaking occurs in the ceramic member during loading of a thermal cycle, and the thermal cycle reliability deteriorates.

CITATION LIST

Patent Documents

Patent Document 1

Japanese Patent No. 3211856

Patent Document 2

Japanese Unexamined Patent Application, First Publication No. 2018-008869

SUMMARY OF INVENTION

Technical Problem

The present invention has been made in consideration of the above-described circumstances, and an objective of the present invention is to provide a copper/ceramic assembly having an excellent thermal cycle reliability, which can suppress the occurrence of breaking in a ceramic member even in a case where a severe thermal cycle is loaded, and an insulating circuit substrate consisting of the copper/ceramic assembly.

Solution to Problem

As a result of diligent studies by the inventors of the present invention in order to solve the above-described problems, it was found that in a case where a ceramic member and a copper member are bonded using a bonding material containing an active metal, a liquid phase generated during the bonding is excluded from the central part of the copper member to the peripheral part, and a relatively large amount of the active metal is present in the peripheral part of the copper member; and thereby, the peripheral part region of the copper member tends to be hard as compared with the central part region at a bonded interface between the ceramic member and the copper member. In addition, the inventors of the present invention obtained a knowledge that during loading of a thermal cycle, stress concentrates on the hard peripheral part region of the copper member at the bonded interface, and thus the breaking of the ceramic member occurs easily.

The present invention has been made based on the above-described findings, and the copper/ceramic assembly according to one aspect of the present invention is a copper/ceramic assembly obtained by bonding a copper member consisting of copper or a copper alloy and a ceramic member consisting of silicon nitride, in which at a bonded interface between the ceramic member and the copper member, an active metal nitride layer is formed on a side of the ceramic member, in a region extending by 10 μm from the active metal nitride layer toward a side of the copper member, an area rate of an active metal compound containing Si and an active metal is 10% or less, and a ratio $P_A/P_B$ of an area rate $P_A$ of the active metal compound in a peripheral part region of the copper member to an area rate $P_B$ of the active metal compound in a central part region of the copper member is in a range of 0.7 or more and 1.4 or less.

It can also be said that the copper/ceramic assembly includes the copper member and the ceramic member, and the copper member and the ceramic member are bonded to each other.

According to the copper/ceramic assembly of one aspect of the present invention, at the bonded interface between the ceramic member and the copper member bonded to at least one surface of the ceramic member, an area rate of an active metal compound containing Si and an active metal is 10% or less in a region extending by 10 μm from the active metal nitride layer toward a side of the copper member. Thereby, the unnecessary hardening of the bonded interface between the ceramic member and the copper member is prevented.

In addition, a ratio $P_A/P_B$ of an area rate $P_A$ of the active metal compound in a peripheral part region of the copper member to an area rate $P_B$ of the active metal compound in a central part region of the copper member is in a range of 0.7 or more and 1.4 or less. Thereby, there is no significant difference in the hardness of the peripheral part region of the copper member and the central part region of the copper member, and the occurrence of breaking in the ceramic member during loading of a thermal cycle can be suppressed, and the thermal cycle reliability is excellent.

In the copper/ceramic assembly according to one aspect of the present invention, it is preferable that a thickness $t1_A$ of the active metal nitride layer formed in the peripheral part region of the copper member and a thickness $t1_B$ of the active metal nitride layer formed in the central part region of the copper member are in a range of 0.05 μm or more and 0.8 μm or less, and a thickness ratio $t1_A/t1_B$ is in a range of 0.7 or more and 1.4 or less.

In this case, the thickness $t1_A$ of the active metal nitride layer formed in the peripheral part region of the copper sheet and the thickness $t1_B$ of the active metal nitride layer formed in the central part region of the copper sheet are in a range of 0.05 μm or more and 0.8 μm or less. Thereby, the active metal reliably and firmly bonds the ceramic member and the copper member, and concurrently, the hardening of the bonded interface is suppressed.

In addition, since the thickness ratio $t1_A/t1_B$ is in a range of 0.7 or more and 1.4 or less, there is no significant difference in the hardness of the bonded interface in the peripheral part region and the central part region of the copper member, and the occurrence of breaking in the ceramic member during loading of a thermal cycle can be further suppressed.

In addition, in the copper/ceramic assembly according to one aspect of the present invention, it is preferable that at the bonded interface between the ceramic member and the copper member, an Ag—Cu alloy layer is formed on the side of the copper member, and a thickness $t2_A$ of the Ag—Cu alloy layer formed in the peripheral part region of the copper member and a thickness $t2_B$ of the Ag—Cu alloy layer formed in the central part region of the copper member are in a range of 1 μm or more and 30 μm or less, and a thickness ratio $t2_A/t2_B$ is in a range of 0.7 or more and 1.4 or less.

In this case, the thickness $t2_A$ of the Ag—Cu alloy layer formed in the peripheral part region of the copper member and the thickness $t2_B$ of the Ag—Cu alloy layer formed in the central part region of the copper member are in a range of 1 μm or more and 30 μm or less. Thereby, the Ag of the bonding material is sufficiently reacted with the copper member to bond the ceramic member and the copper member reliably and firmly, and concurrently, the hardening of the bonded interface is suppressed.

In addition, since the thickness ratio $t2_A/t2_B$ is in a range of 0.7 or more and 1.4 or less, there is no significant difference in the hardness of the bonded interface in the peripheral part region and the central part region of the copper member, and the occurrence of breaking in the ceramic member during loading of a thermal cycle can be further suppressed.

The insulating circuit board according to one aspect of the present invention is an insulating circuit substrate obtained by bonding a copper sheet consisting of copper or a copper alloy to a surface of a ceramic substrate consisting of silicon nitride, in which at a bonded interface between the ceramic substrate and the copper sheet, an active metal nitride layer is formed on a side of the ceramic substrate, in a region extending by 10 μm from the active metal nitride layer toward a side of the copper sheet, an area rate of an active metal compound containing Si and an active metal is 10% or less, and a ratio $P_A/P_B$ of an area rate $P_A$ of the active metal compound in a peripheral part region of the copper sheet to an area rate $P_B$ of the active metal compound in a central part region of the copper sheet is in a range of 0.7 or more and 1.4 or less.

It can also be said that the insulating circuit substrate includes the ceramic substrate and the copper sheet, and the copper sheet is bonded to the surface of the ceramic substrate.

According to the insulating circuit substrate of one aspect of the present invention, at the bonded interface between the ceramic substrate and the copper sheet bonded to at least one surface of the ceramic substrate, an area rate of an active metal compound containing Si and an active metal is 10% or less in a region extending by 10 μm from the active metal nitride layer toward a side of the copper sheet. Thereby, the unnecessary hardening of the bonded interface between the ceramic substrate and the copper sheet is prevented.

In addition, a ratio $P_A/P_B$ of an area rate $P_A$ of the active metal compound in a peripheral part region of the copper sheet to an area rate $P_B$ of the active metal compound in a central part region of the copper sheet is in a range of 0.7 or more and 1.4 or less. Thereby, there is no significant difference in the hardness of the peripheral part region of the copper sheet and the central part region of the copper sheet, and the occurrence of breaking in the ceramic substrate during loading of a thermal cycle can be suppressed, and the thermal cycle reliability is excellent.

In the insulating circuit substrate according to one aspect of the present invention, it is preferable that a thickness $t1_A$ of the active metal nitride layer formed in the peripheral part region of the copper sheet and a thickness $t1_B$ of the active metal nitride layer formed in the central part region of the copper sheet are in a range of 0.05 μm or more and 0.8 μm or less, and a thickness ratio $t1_A/t1_B$ is in a range of 0.7 or more and 1.4 or less.

In this case, the thickness $t1_A$ of the active metal nitride layer formed in the peripheral part region of the copper member and the thickness tin of the active metal nitride layer formed in the central part region of the copper member are in a range of 0.05 μm or more and 0.8 μm or less. Thereby, the active metal reliably and firmly bonds the ceramic substrate and the copper sheet, and concurrently, the hardening of the bonded interface is suppressed.

In addition, since the thickness ratio $t1_A/t1_B$ is in a range of 0.7 or more and 1.4 or less, there is no significant difference in the hardness of the bonded interface in the peripheral part region and the central part region of the copper sheet, and the occurrence of breaking in the ceramic substrate during loading of a thermal cycle can be further suppressed.

In addition, in the insulating circuit substrate according to one aspect of the present invention, it is preferable that at the bonded interface between the ceramic substrate and the copper sheet, an Ag—Cu alloy layer is formed on the side of the copper sheet, and a thickness $t2_A$ of the Ag—Cu alloy layer formed in the peripheral part region of the copper sheet and a thickness $t2_B$ of the Ag—Cu alloy layer formed in the central part region of the copper sheet are in a range of 1 μm or more and 30 μm or less, and a thickness ratio $t2_A/t2_B$ is in a range of 0.7 or more and 1.4 or less.

In this case, the thickness $t2_A$ of the Ag—Cu alloy layer formed in the peripheral part region of the copper sheet and the thickness $t2_B$ of the Ag—Cu alloy layer formed in the central part region of the copper sheet are in a range of 1 μm or more and 30 μm or less. Thereby, the Ag of the bonding material is sufficiently reacted with the copper sheet to bond the ceramic substrate and the copper sheet reliably and firmly, and concurrently, the hardening of the bonded interface is suppressed.

In addition, since the thickness ratio $t2_A/t2_B$ is in a range of 0.7 or more and 1.4 or less, there is no significant difference in the hardness of the bonded interface in the peripheral part region and the central part region of the copper sheet, and the occurrence of breaking in the ceramic substrate during loading of a thermal cycle can be further suppressed.

Advantageous Effects of Invention

According to one aspect of the present invention, it is possible to provide a copper/ceramic assembly having an excellent thermal cycle reliability, which can suppress the occurrence of breaking in a ceramic member even in a case where a severe thermal cycle is loaded, and an insulating circuit substrate consisting of the copper/ceramic assembly.

DESCRIPTION OF EMBODIMENTS

Hereinafter, embodiments of the present invention will be described with reference to the accompanying drawings.

Figure 1:
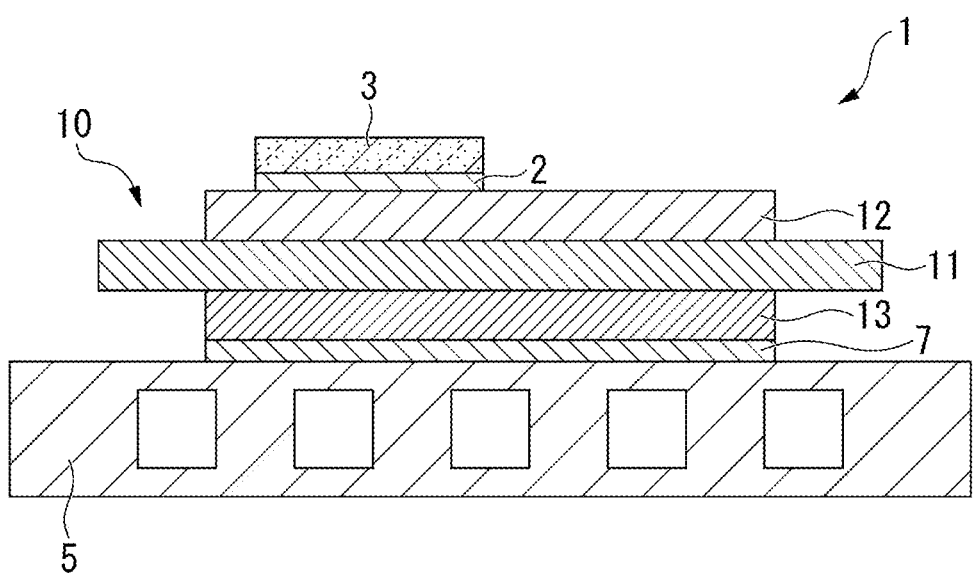
FIG. 1 is a schematic explanatory view of a power module using an insulating circuit substrate according to the embodiment of the present invention.

The copper/ceramic assembly according to the present embodiment is an insulating circuit substrate 10 obtained by bonding a copper sheet 42 (a circuit layer 12) and a copper sheet 43 (a metal layer 13) as copper members consisting of copper or a copper alloy to a ceramic substrate 11 as a ceramic member consisting of ceramics. FIG. 1 shows a power module 1 including the insulating circuit substrate 10 according to the present embodiment.

The power module 1 includes: the insulating circuit substrate 10 in which each of the circuit layer 12 and the metal layer 13 is arranged; a semiconductor element 3 bonded to one surface (the upper surface in FIG. 1) of the circuit layer 12 by interposing a bonding layer 2; and a heat sink 5 disposed on the other surface (the lower surface in FIG. 1) of the metal layer 13.

The semiconductor element 3 includes a semiconductor material such as Si. The semiconductor element 3 and the circuit layer 12 are bonded with the bonding layer 2 being interposed therebetween.

The bonding layer 2 is composed of, for example, an Sn—Ag-based solder material, an Sn—In-based solder material, or an Sn—Ag—Cu-based solder material.

The heat sink 5 is a heat sink for dissipating heat from the insulating circuit substrate 10 described above. The heat sink 5 is composed of copper or a copper alloy, and in the present embodiment, it is composed of phosphorus deoxidized copper. The heat sink 5 includes a passage for allowing a cooling fluid to flow.

It is noted that in the present embodiment, the heat sink 5 is bonded to the metal layer 13 by a solder layer 7 which consists of a solder material. The solder layer 7 is composed of, for example, an Sn—Ag-based solder material, an Sn—In-based solder material, or an Sn—Ag—Cu-based solder material.

In addition, the insulating circuit substrate 10 which is the present embodiment includes, as shown in FIG. 1, the ceramic substrate 11, the circuit layer 12 arranged on one surface of the ceramic substrate 11 (the upper surface in FIG. 1), and the metal layer 13 arranged on the other surface of the ceramic substrate 11 (the lower surface in FIG. 1).

The ceramic substrate 11 is composed of silicon nitride ($Si_3N_4$, which has excellent insulating properties and heat radiation. The thickness of the ceramic substrate 11 is set to be, for example, in a range of 0.2 mm or more and 1.5 mm or less, and the thickness thereof is 0.32 mm in the present embodiment.

Figure 4:
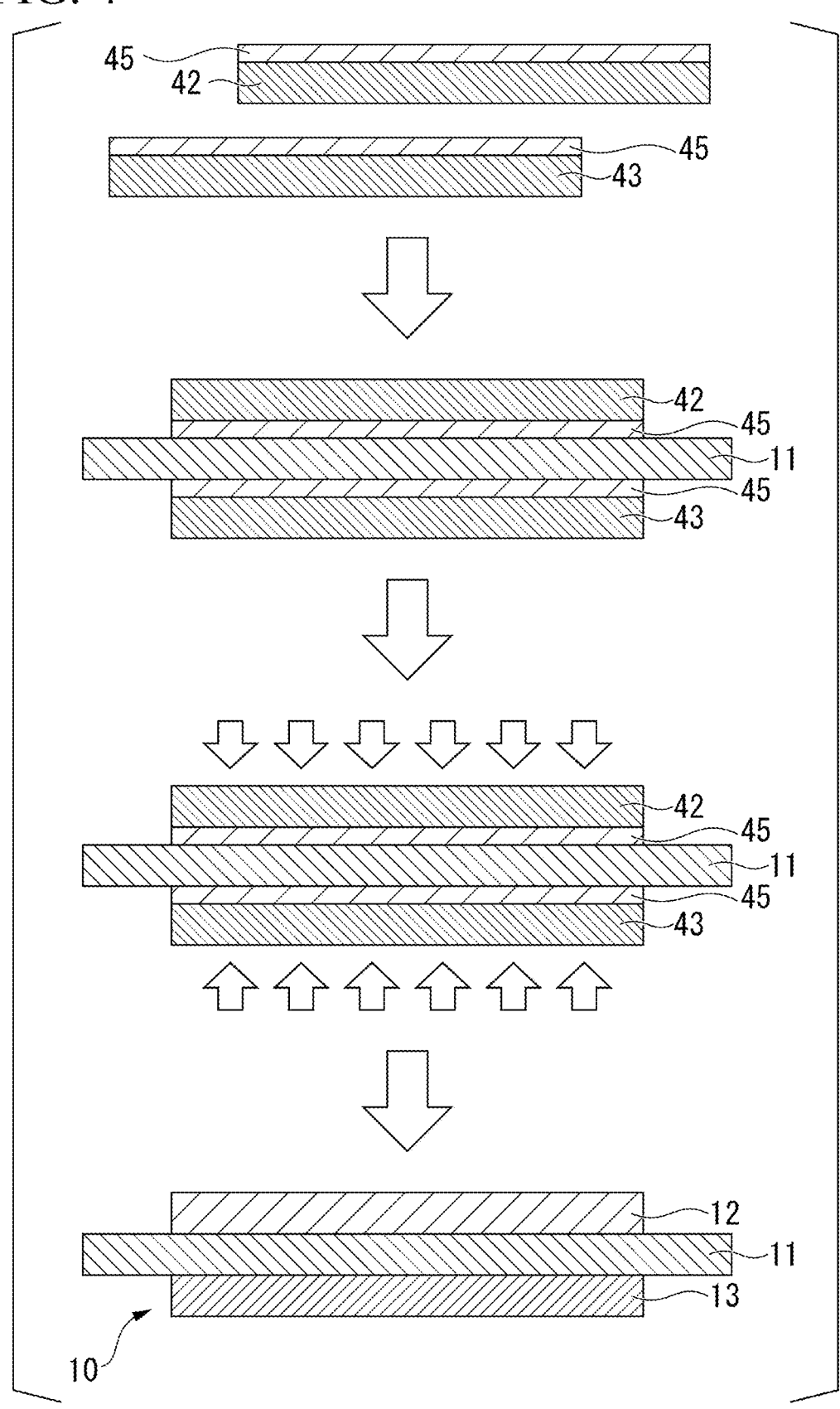
FIG. 4 is a schematic explanatory view of the method for producing the insulating circuit substrate according to the embodiment of the present invention.

As shown in FIG. 4, the circuit layer 12 is formed by bonding the copper sheet 42 consisting of copper or a copper alloy to one surface (the upper surface in FIG. 4) of the ceramic substrate 11.

In the present embodiment, the circuit layer 12 is formed by bonding a rolled sheet of oxygen-free copper to the ceramic substrate 11.

It is noted that the thickness of the copper sheet 42 which is to be the circuit layer 12 is set to be in a range of 0.1 mm or more and 2.0 mm or less, and the thickness is 0.6 mm in the present embodiment.

As shown in FIG. 4, the metal layer 13 is formed by bonding the copper sheet 43 consisting of copper or a copper alloy to the other surface (the lower surface in FIG. 4) of the ceramic substrate 11.

In the present embodiment, the metal layer 13 is formed by bonding a rolled sheet of oxygen-free copper to the ceramic substrate 11.

It is noted that the thickness of the copper sheet 43 which is to be the metal layer 13 is set to be in a range of 0.1 mm or more and 2.0 mm or less, and the thickness is 0.6 mm in the present embodiment.

At the bonded interface between the ceramic substrate 11 and each of the circuit layer 12 and the metal layer 13, as

7

Figure 2:
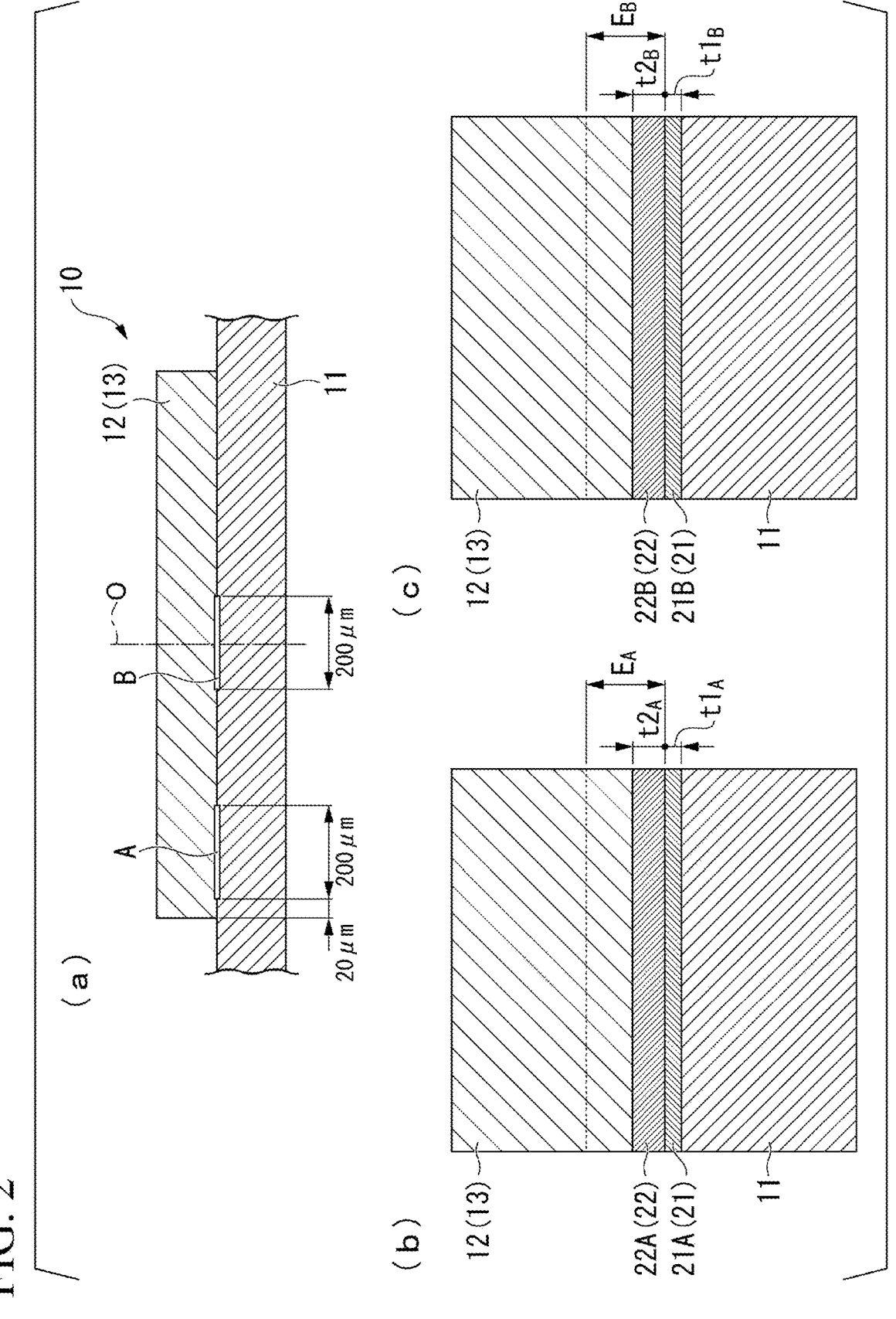
FIG. 2 is an enlarged explanatory view of a bonded interface between a circuit layer (a metal layer) and a ceramic substrate of the insulating circuit substrate according to the embodiment of the present invention. (a) is an explanatory view of the peripheral part region and the central part region of the circuit layer and the metal layer, (b) is an explanatory view of the peripheral part region, and (c) is an explanatory view of the central part region.

8 shown in FIG. 2, an active metal nitride layer 21 and an Ag—Cu alloy layer 22 are formed in this order from the side of the ceramic substrate 11.

It can also be said that the active metal nitride layer 21 is a part of the ceramic substrate 11. It can also be said that the Ag—Cu alloy layer 22 is a part of each of the circuit layer 12 and the metal layer 13. For this reason, the bonded interface between the ceramic substrate 11 and each of the circuit layer 12 and the metal layer 13 (the copper sheets 42 and 43) is an interface between the active metal nitride layer 21 and the Ag—Cu alloy layer 22. In a case where the Ag—Cu alloy layer 22 is not provided, the bonded interface between the ceramic substrate 11 and each of the circuit layer 12 and the metal layer 13 (the copper sheets 42 and 43) is an interface between the active metal nitride layer 21 and each of the circuit layer 12 and the metal layer 13 (the copper sheets 42 and 43).

In addition, in the insulating circuit substrate 10 which is the present embodiment, as shown in FIG. 2(a), an interface structure in a peripheral part region A and a central part region B of each of the circuit layer 12 and the metal layer 13 is defined as follows.

It is noted that in the present embodiment, the peripheral part region A of each of the circuit layer 12 and the metal layer 13 is, as shown in FIG. 2(a), a region starting from a position at 20 μm inward from an end portion of each of the circuit layer 12 and the metal layer 13 in a width direction to a position at 200 μm inward in the width direction therefrom in a cross section along the lamination direction in which each of the circuit layer 12 and the metal layer 13 is laminated with the ceramic substrate 11.

In addition, as shown in FIG. 2(a), the central part region B of each of the circuit layer 12 and the metal layer 13 is a region of 200 μm in the width direction, which includes the center of each of the circuit layer 12 and the metal layer 13 in the width direction in a cross section along the lamination direction in which each of the circuit layer 12 and the metal layer 13 is laminated with the ceramic substrate 11.

As shown in FIG. 2(b), in the peripheral part region A of the bonded interface between the ceramic substrate 11 and each of the circuit layer 12 and the metal layer 13, an area rate $P_A$ of an active metal compound containing Si and an active metal (Ti in the present embodiment) is 10% or less in a region $E_A$ of 10 μm from the interface of the active metal nitride layer 21 on the circuit layer 12 (metal layer 13) side (the interface between the active metal nitride layer 21 and the Ag—Cu alloy layer 22) to the circuit layer 12 (metal layer 13) side.

In addition, as shown in FIG. 2(c), in the central part region B of the bonded interface between the ceramic substrate 11 and each of the circuit layer 12 and the metal layer 13, an area rate $P_B$ of an active metal compound containing Si and an active metal (Ti in the present embodiment) is 10% or less in a region $E_B$ of 10 μm from the interface of the active metal nitride layer 21 on the circuit layer 12 (metal layer 13) side (the interface between the active metal nitride layer 21 and the Ag—Cu alloy layer 22) to the circuit layer 12 (metal layer 13) side.

In addition, in the present embodiment, a ratio $P_A/P_B$ of an area rate $P_A$ of the active metal compound in the peripheral part region A of the bonded interface between the ceramic substrate 11 and each of the circuit layer 12 and the metal layer 13 to an area rate $P_B$ of the active metal compound in the central part region B of the bonded interface between the ceramic substrate 11 and each of the circuit layer 12 and the metal layer 13 is in a range of 0.7 or more and 1.4 or less.

It is noted that examples of the intermetallic compound (an active metal compound) containing Si and an active metal (Ti) include $TiSi_2$, $TiSi$, $Ti_5Si_4$, $Ti_5Si_3$, and $Ti_5Si$, and in the present embodiment, $Ti_5Si_3$ is adopted.

In addition, in the present embodiment, a thickness $t1_A$ of an active metal nitride layer 21A formed in the peripheral part region A of the bonded interface between the ceramic substrate 11 and each of the circuit layer 12 and the metal layer 13, and a thickness $t1_B$ of an active metal nitride layer 21B formed in the central part region B of the bonded interface between the ceramic substrate 11 and each of the circuit layer 12 and the metal layer 13 are in a range of 0.05 μm or more and 0.8 μm or less, and it is preferable that a thickness ratio $t1_A/t1_B$ thereof is in a range of 0.7 or more and 1.4 or less. The active metal nitride layer 21 (21A and 21B) is formed by aggregating active metal nitride particles. The average particle size of these particles is 10 nm or more and 100 nm or less.

It is noted that in the present embodiment, since a bonding material 45 contains Ti as an active metal and the ceramic substrate 11 is composed of silicon nitride, the active metal nitride layer 21 (21A and 21B) is composed of titanium nitride (TiN). That is, the active metal nitride layer 21 (21A and 21B) is formed by aggregating particles of titanium nitride (TiN) having an average particle size of 10 nm or more and 100 nm or less.

Further, in the present embodiment, it is preferable that a ratio $t2_A/t2_B$ of a thickness $t2_A$ of an Ag—Cu alloy layer 22A formed in the peripheral part region A of the bonded interface between the ceramic substrate 11 and each of the circuit layer 12 and the metal layer 13, to a thickness $t2_B$ of an Ag—Cu alloy layer 22B formed in the central part region B of the bonded interface between the ceramic substrate 11 and each of the circuit layer 12 and the metal layer 13 is in a range of 0.7 or more and 1.4 or less.

In addition, the thickness of the Ag—Cu alloy layer 22 (22A and 22B) is preferably 1 μm or more and 30 μm or less.

Figure 3:
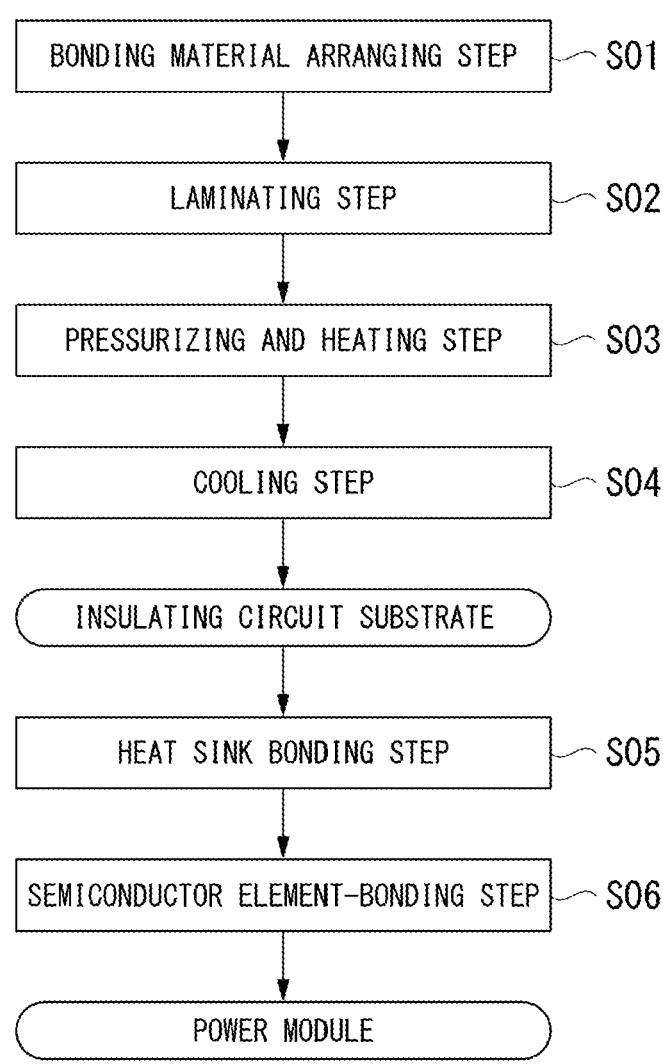
FIG. 3 is a flow chart of a method for producing the insulating circuit substrate according to the embodiment of the present invention.

Hereinafter, a method for producing the insulating circuit substrate 10 according to the present embodiment will be described with reference to FIG. 3 and FIG. 4.

(Bonding Material Arranging Step S01)

The copper sheet 42 which is to be the circuit layer 12 and the copper sheet 43 which is to be the metal layer 13 are prepared.

Then, the bonding material 45 is applied and dried on the bonding surface of the copper sheet 42 which is to be the circuit layer 12 and the bonding surface of the copper sheet 43 which is to be the metal layer 13. The coating thickness of the paste-like bonding material 45 is preferably in a range of 10 μm or more and 50 μm or less after drying.

In the present embodiment, the paste-like bonding material 45 is applied by screen printing.

The bonding material 45 is a bonding material containing Ag and an active metal (one or more selected from Ti, Zr, Nb, or Hf). In the present embodiment, an Ag—Ti-based brazing material (an Ag—Cu—Ti-based brazing material) is used as the bonding material 45. As the Ag—Ti-based brazing material (the Ag—Cu—Ti-based brazing material), it is preferable to use, for example, a brazing material which contains: Cu in an amount of 0% by mass or more and 45% by mass or less; and Ti which is an active metal in an amount of 0.5% by mass or more and 20% by mass or less, with a balance of Ag and inevitable impurities.

The specific surface area of the Ag powder contained in the bonding material 45 is preferably 0.15 m²/g or more, more preferably 0.25 m²/g or more, and still more preferably 0.40 m²/g or more. On the other hand, the specific surface area of the Ag powder contained in the bonding material 45 is preferably 1.40 m²/g or less, more preferably 1.00 m²/g or less, and still more preferably 0.75 m²/g or less.

Regarding the particle diameter of the Ag powder contained in the paste-like bonding material 45, it is preferable that D10 is in a range of 0.7 μm or more and 3.5 μm or less and D100 is 4.5 μm or more and 23 μm or less. D10 is a particle diameter at which the cumulative frequency is 10% on a volume basis in a particle size distribution measured according to a laser diffraction scattering type particle size distribution measuring method, and D100 is a particle diameter at which the cumulative frequency is 100% on a volume basis.

In a pressurizing and heating step S03 described later, a generated liquid phase is excluded from the central part of the copper sheets 42 and 43 to the peripheral part side by applying a pressure in the lamination direction; and thereby, a relatively large amount of the active metal component is present in the peripheral part of each of the copper sheets 42 and 43.

Figure 5:
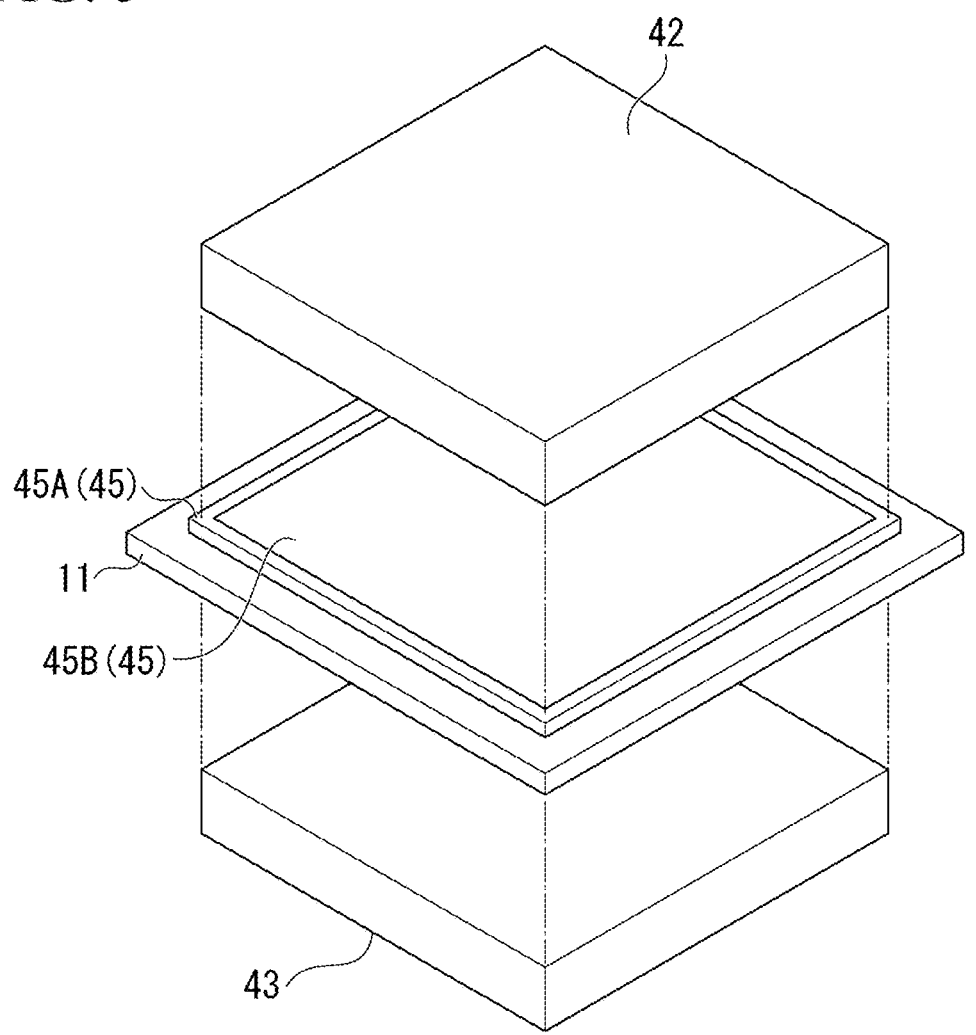
FIG. 5 is an explanatory view of a bonding material arranging step in the method for producing the insulating circuit substrate according to the embodiment of the present invention.

Therefore, in the present embodiment, as shown in FIG. 5, the bonding material 45 is applied so that a coating thickness of a bonding material 45A on the peripheral part of each of the copper sheet 42 which is to be the circuit layer 12 and the copper sheet 43 which is to be the metal layer 13 is thinner than a coating thickness of a bonding material 45A on the central part of each of the copper sheet 42 which is to be the circuit layer 12 and the copper sheet 43 which is to be the metal layer 13.

It is noted that a difference between the coating thickness of a bonding material 45A on the peripheral part of each of the copper sheet 42 which is to be the circuit layer 12 and the copper sheet 43 which is to be the metal layer 13, and the coating thickness of the bonding material 45B in the central part is preferably in a range of 5 μm or more and 15 μm or less.

The peripheral part onto which the bonding material 45A is applied is a peripheral portion which includes a peripheral part region and has an area of 1.5% to 10% of the surface area of each of the copper sheets 42 and 43, where the line width of the peripheral part is at most 1 mm. The central part onto which the bonding material 45B is applied is a central portion which includes a central part region and has an area of 90% to 98.5% of the surface area of each of the copper sheets 42 and 43.

(Laminating Step S02)

Next, the copper sheet 42 which is to be the circuit layer 12 is laminated on one surface (the upper surface in FIG. 4) of the ceramic substrate 11 while interposing the bonding material 45 therebetween, and concurrently, the copper sheet 43 which is to be the metal layer 13 is laminated on the other surface (the lower surface in FIG. 4) of the ceramic substrate 11 while interposing the bonding material 45 therebetween.

(Pressurizing and Heating Step S03)

Next, the copper sheet 42, the ceramic substrate 11, and the copper sheet 43 are heated in a pressurized state in a heating furnace in a vacuum atmosphere, and the bonding material 45 is melted.

The heating temperature in the pressurizing and heating step S03 is preferably set to be in a range of 800° C. or higher and 850° C. or lower. It is preferable that the total of the temperature integral values in the temperature raising step from 780° C. to the heating temperature and the holding step at the heating temperature is set to be in a range of 7° C.·h or more and 120° C.·h or less.

In addition, the pressurization load in the pressurizing and heating step S03 is preferably set to be in a range of 0.029 MPa or more and 2.94 MPa or less.

Further, the degree of vacuum in the pressurizing and heating step S03 is preferably set to be in a range of $1 \times 10^{-6}$ Pa or more and $5 \times 10^{-2}$ Pa or less.

(Cooling Step S04)

Then, after the pressurizing and heating step S03, cooling is carried out to solidify the molten bonding material 45; and thereby, the copper sheet 42 which is to be the circuit layer 12 is bonded to the ceramic substrate 11, and the copper sheet 43 which is to be the metal layer 13 is bonded to the ceramic substrate 11.

It is noted that the cooling rate in the cooling step S04 is preferably set to be in a range of 2° C./min or more and 20° C./min or less. It is noted that the cooling rate is a cooling rate from the heating temperature to 780° C., which is an Ag—Cu eutectic temperature.

As described above, the insulating circuit substrate 10 which is the present embodiment is produced by the bonding material arranging step S01, the laminating step S02, the pressurizing and heating step S03, and the cooling step S04.

(Heat Sink Bonding Step S05)

Next, the heat sink 5 is bonded to the other surface side of the metal layer 13 of the insulating circuit substrate 10.

The insulating circuit substrate 10 and the heat sink 5 are laminated with a solder material being interposed therebetween and charged into a heating furnace, and the insulating circuit substrate 10 and the heat sink 5 are subjected to solder bonding with the solder layer 7 being interposed therebetween.

(Semiconductor Element-Bonding Step S06)

Next, the semiconductor element 3 is bonded by soldering to one surface of the circuit layer 12 of the insulating circuit substrate 10.

The power module 1 shown in FIG. 1 is produced by the above-described steps.

According to the insulating circuit substrate 10 (copper/ceramic assembly) according to the present embodiment which has the above-described configuration, in the peripheral part region A of the bonded interface between the ceramic substrate 11 and each of the circuit layer 12 and the metal layer 13, an area rate $P_A$ of an active metal compound containing Si and an active metal (Ti in the present embodiment) is 10% or less in a region $E_A$ extending by 10 μm from the interface of the active metal nitride layer 21 on the circuit layer 12 (metal layer 13) side (the interface between the active metal nitride layer 21 and the Ag—Cu alloy layer 22) toward the circuit layer 12 (metal layer 13) side, and concurrently, in the central part region B of the bonded interface between the ceramic substrate 11 and each of the circuit layer 12 and the metal layer 13, an area rate $P_B$ of an active metal compound containing Si and an active metal (Ti in the present embodiment) is 10% or less in a region $E_B$ extending by 10 μm from the interface of the active metal nitride layer 21 on the circuit layer 12 (metal layer 13) side (the interface between the active metal nitride layer 21 and the Ag—Cu alloy layer 22) toward the circuit layer 12 (metal layer 13) side. Thereby, the unnecessary hardening of the bonded interface between the ceramic substrate 11 and the circuit layer 12 and the bonded interface between ceramic substrate and the metal layer 13 is prevented.

It is noted that in order to further suppress the unnecessary hardening of the bonded interface between the ceramic substrate 11 and the circuit layer 12 and the bonded interface between the ceramic substrate 11 and the metal layer 13, the above-described area rates $P_A$ and $P_B$ of the active metal compound are preferably 8% or less, more preferably 7% or less, and still more preferably 5% or less. In addition, the area rates $P_A$ and $P_B$ of the active metal compound are preferably 1.5% or more, more preferably 2% or more, and still more preferably 3% or more.

In addition, a ratio $P_A/P_B$ of an area rate $P_A$ of the active metal compound in a peripheral part region A of each of the circuit layer 12 and the metal layer 13 to an area rate $P_B$ of the active metal compound in a central part region B of each of the circuit layer 12 and the metal layer 13 is in a range of 0.7 or more and 1.4 or less. Thereby, there is no significant difference in hardness between the peripheral part region A of each of the circuit layer 12 and the metal layer 13, and the central part region B of each of the circuit layer 12 and the metal layer 13, it is possible to suppress the occurrence of breaking in the ceramic substrate 11 during loading of a thermal cycle, and the thermal cycle reliability is excellent.

It is noted that in order to further improve the thermal cycle reliability, a ratio $P_A/P_B$ of an area rate $P_A$ of the active metal compound in a peripheral part region A of each of the circuit layer 12 and the metal layer 13 to an area rate $P_B$ of the active metal compound in a central part region B of each of the circuit layer 12 and the metal layer 13 is preferably in a range of 0.8 or more and 1.2 or less and more preferably in a range of 0.9 or more and 1.1 or less.

In addition, in the present embodiment, in a case where a thickness $t1_A$ of an active metal nitride layer 21A formed in the peripheral part region A of each of the circuit layer 12 and the metal layer 13, and a thickness $t1_B$ of an active metal nitride layer 21B formed in the central part region B of each of the circuit layer 12 and the metal layer 13 are in a range of 0.05 μm or more and 0.8 μm or less, each of the circuit layer 12 and the metal layer 13 is bonded to the ceramic substrate 11 by the active metal reliably and firmly, and concurrently, the hardening of the bonded interface is further suppressed.

It is noted that in order to more firmly bond the circuit layer 12 and the metal layer 13 to the ceramic substrate 11, a thickness $t1_A$ of an active metal nitride layer 21A formed in the peripheral part region A of each of the circuit layer 12 and the metal layer 13, and a thickness $t1_B$ of an active metal nitride layer 21B formed in the central part region B of each of the circuit layer 12 and the metal layer 13 are preferably 0.08 μm or more and more preferably 0.15 μm or more.

In addition, in order to further suppress the unnecessary hardening of the bonded interface, a thickness $t1_A$ of an active metal nitride layer 21A formed in the peripheral part region A of each of the circuit layer 12 and the metal layer 13, and a thickness $t1_B$ of an active metal nitride layer 21B formed in the central part region B of each of the circuit layer 12 and the metal layer 13 are preferably 0.6 am or less and more preferably 0.4 m or less.

Further, in the present embodiment, in a case where a ratio $t1_A/t1_B$ of a thickness $t1_A$ of an active metal nitride layer 21A formed in the peripheral part region A of each of the circuit layer 12 and the metal layer 13, to a thickness $t1_B$ of an active metal nitride layer 21B formed in the central part region B of each of the circuit layer 12 and the metal layer 13 is in a range of 0.7 or more and 1.4 or less, there is no significant difference in the hardness of the bonded interface in the peripheral part region A and the central part region B of each of the circuit layer 12 and the metal layer 13, and it is possible to further suppress the occurrence of breaking in the ceramic substrate 11 during loading of a thermal cycle.

It is noted that in order to further suppress the occurrence of breaking in the ceramic substrate 11 during loading of a thermal cycle, a ratio $t1_A/t1_B$ of a thickness $t1_A$ of an active metal nitride layer 21A formed in the peripheral part region A of each of the circuit layer 12 and the metal layer 13, to a thickness $t1_B$ of an active metal nitride layer 21B formed in the central part region B of each of the circuit layer 12 and the metal layer 13 is preferably in a range of 0.8 or more and 1.2 or less and more preferably in a range of 0.9 or more and 1.1 or less.

In addition, in the present embodiment, in a case where the thickness $t2_A$ of the Ag—Cu alloy layer 22A formed in the peripheral part region A of each of the circuit layer 12 and the metal layer 13, and the thickness $t2_B$ of the Ag—Cu alloy layer 22B formed in the central part region B of each of the circuit layer 12 and the metal layer 13 are in a range of 1 μm or more and 30 μm or less, Ag of the bonding material 45 described later is sufficiently reacted with each of the circuit layer 12 and the metal layer 13, the ceramic substrate 11 and each of the circuit layer 12 and the metal layer 13 are reliably and firmly bonded to each other, and concurrently, the hardening of the bonded interface is suppressed.

It is noted that in order to more firmly bond the circuit layer 12 and the metal layer 13 to the ceramic substrate 11, the thickness $t2_A$ of the Ag—Cu alloy layer 22A formed in the peripheral part region A of each of the circuit layer 12 and the metal layer 13, and the thickness $t2_B$ of the Ag—Cu alloy layer 22B formed in the central part region B of each of the circuit layer 12 and the metal layer 13 are preferably 3 μm or more and more preferably 5 μm or more.

In addition, in order to further suppress the unnecessary hardening of the bonded interface, the thickness $t2_A$ of the Ag—Cu alloy layer 22A formed in the peripheral part region A of each of the circuit layer 12 and the metal layer 13, and the thickness $t2_B$ of the Ag—Cu alloy layer 22B formed in the central part region B of each of the circuit layer 12 and the metal layer 13 are preferably 25 Lm or less and more preferably 15 μm or less.

Further, in the present embodiment, in a case where the ratio $t2_A/t2_B$ of the thickness $t2_A$ of the Ag—Cu alloy layer 22A formed in the peripheral part region A of each of the circuit layer 12 and the metal layer 13, to the thickness $t2_B$ of the Ag—Cu alloy layer 22B formed in the central part region B of each of the circuit layer 12 and the metal layer 13 is in a range of 0.7 or more and 1.4 or less, there is no significant difference in the hardness of the bonded interface in the peripheral part region A and the central part region B of each of the circuit layer 12 and the metal layer 13, and it is possible to further suppress the occurrence of breaking in the ceramic substrate during loading of a thermal cycle.

It is noted that in order to further suppress the occurrence of breaking in the ceramic substrate 11 during loading of a thermal cycle, the ratio $t2_A/t2_B$ of the thickness $t2_A$ of the Ag—Cu alloy layer 22A formed in the peripheral part region A of each of the circuit layer 12 and the metal layer 13, to the thickness $t2n$ of the Ag—Cu alloy layer 22B formed in the central part region B of each of the circuit layer 12 and the metal layer 13 is preferably in a range of 0.8 or more and 1.2 or less and more preferably in a range of 0.9 or more and 1.1 or less.

Although the embodiments of the present invention were described above, the present invention is not limited thereto, and appropriate modification is possible in a range not departing from the technical features of the invention.

For example, the present embodiment has been described such that a semiconductor element is mounted on an insulating circuit substrate to constitute a power module; however, the present embodiment is not limited thereto. For example, an LED element may be mounted on a circuit layer of an insulating circuit substrate to constitute an LED module, or a thermoelectric element may be mounted on a circuit layer of an insulating circuit substrate to constitute a thermoelectric module.

Further, in the present embodiment, the description has been made using Ti as an example of the active metal contained in the bonding material. However, the present embodiment is not limited thereto, and any one or two or more active metals selected from Ti, Zr, Hf, and Nb may be contained. It is noted that these active metals may be contained as hydrides.

In addition, in the present embodiment, the description has been made such that the area rate $P_A$ of the active metal compound in the peripheral part region of each of the circuit layer and the metal layer and the area rate $P_B$ of the active metal compound in the central part region of each of the circuit layer and the metal layer are controlled by adjusting the coating thickness of the bonding material in each of the peripheral part and the central part of the copper sheet. However, the present invention is not limited thereto, and the area rate $P_A$ of the active metal compound in the peripheral part region of each of the circuit layer and the metal layer and the area rate $P_B$ of the active metal compound in the central part region of each of the circuit layer and the metal layer may be controlled by using a different bonding material to be applied onto each of the peripheral part and the central part of the copper sheet.

For example, it is possible to control the above-described area rates $P_A$ and $P_B$ of the active metal compound by adjusting the specific surface area (BET value) of the Ag powder contained in the bonding material. That is, in a case where the specific surface area of the Ag powder is small, the sinterability of the paste-like bonding material increases, a liquid phase is easily generated in the pressurizing and heating step, the diffusion of the active metal is accelerated, and the area rate of the active metal compound described above becomes high. On the other hand, in a case where the specific surface area of the Ag powder is large, the sinterability of the paste-like bonding material decreases, a liquid phase is difficult to be generated in the pressurizing and heating step, the diffusion of the active metal is suppressed, and the area rate of the active metal compound described above becomes low.

In addition, bonding materials containing active metals of which kinds or amounts are different from each other may be used to be separately coated on the peripheral part and the central part of the copper sheet.

Further, in the present embodiment, the description has been made such that the circuit layer is formed by bonding a rolled sheet of oxygen-free copper to the ceramic substrate. However, the present invention is not limited thereto, and the circuit layer may be formed by bonding copper pieces which are obtained by punching a copper sheet to the ceramic substrate in a state where the copper pieces are disposed in a circuit pattern. In this case, it is sufficient that each of the copper pieces has such an interface structure as described above between the copper piece and the ceramic substrate.

In addition, in the present embodiment, the description has been made such that the bonding material is arranged on the bonding surface of the copper sheet. However, the present invention is not limited thereto, and it is sufficient that the bonding material is arranged between the ceramic substrate and the copper sheet, and the bonding material may be arranged on the bonding surface of the ceramic substrate.

Examples

Hereinafter, a description will be given for the results of confirmatory experiments carried out to confirm the effectiveness of the present invention.

First, a ceramic substrate (40 mm×40 mm, thickness: 0.32 mm) consisting of silicon nitride ($Si_3N_4$) was prepared.

In addition, as the copper sheet which was to be a circuit layer, a copper sheet consisting of oxygen-free copper and having a size of 37 mm×37 mm and a thickness of 0.8 mm were prepared. Further, as the copper sheet which was to be a metal layer, a copper sheet consisting of oxygen-free copper and having a size of 37 mm×37 mm and a thickness of 0.8 mm was prepared.

A bonding material containing an Ag powder having a BET value shown in Table 1 was applied onto the peripheral part of the copper sheet which was to be each of a circuit layer and a metal layer so that the target thickness after drying was the value shown in Table 1.

In addition, a bonding material containing an Ag powder having a BET value shown in Table 1 was applied onto the central part of the copper sheet which was to be each of a circuit layer and a metal layer so that the target thickness after drying was the value shown in Table 1.

It is noted that a paste material was used as the bonding material, and the amounts of Ag, Cu, and the active metal were as shown in Table 1.

In addition, vacuum degassing was carried out as a pretreatment by heating at 150° C. for 30 minutes, and the BET value (specific surface area) of the Ag powder was measured using AUTOSORB-1 manufactured by QUANTACHROME Corporation by a BET multipoint method under the conditions of $N_2$ adsorption and liquid nitrogen of 77 K.

A copper sheet which was to be a circuit layer was laminated on one surface of the ceramic substrate. In addition, a copper sheet which was to be a metal layer was laminated on the other surface of the ceramic substrate.

This laminate was heated in a state of being pressurized in the lamination direction to generate an Ag—Cu liquid phase. In this case, the pressurization load was set to 0.294 MPa, and the temperature integral value was as shown in Table 2.

Then, the heated laminate was cooled to bond the copper sheet which was to be the circuit layer, the ceramic substrate, and the metal sheet which was to be the metal layer to each other; and thereby, an insulating circuit substrate (copper/ceramic assembly) was obtained.

Regarding the obtained insulating circuit substrate (copper/ceramic assembly), the area rate of the active metal compound, the active metal nitride layer, the Ag—Cu alloy layer, and the thermal cycle reliability were evaluated as follows.

(Area Rate of Active Metal Compound)

A cross section of the bonded interface between the ceramic substrate and each of the circuit layer and the metal layer was observed with an EPMA device, and an element map (width 50 μm×height 30 μm) of the active metal and Si in the peripheral part region and the central part region of each of the circuit layer and the metal layer was acquired for five visual fields.

Figure 6:
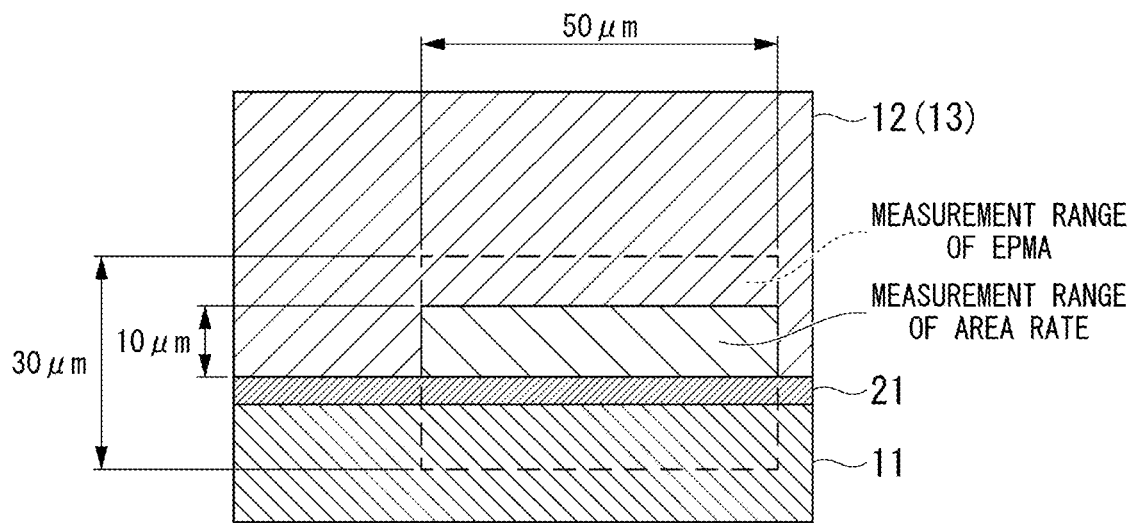
FIG. 6 is an explanatory view showing a method for calculating an area rate of an active metal compound in Examples of the present invention.

Then, as shown in FIG. 6, in a region from the active metal nitride layer to 10 μm toward the circuit layer (metal layer) surface, a portion where Si and the active metal overlapped was regarded as an area of the active metal compound containing Si and the active metal, and the area rate of the active metal compound was calculated. The area rate was a value in a case where an area of 50 km×10 μm was set to 100%. It is noted that Table 2 shows the average values from both the five visual fields, that is, a total of ten visual fields.

(Active Metal Nitride Layer)

A cross section of the bonded interface between the ceramic substrate and each of the circuit layer and the metal layer was subjected to measurement at a magnification of 30000 times using an electron scanning microscope (ULTRA55 manufactured by Carl Zeiss NTS, LLC, acceleration voltage: 1.8 kV), and element mapping of N and the active metal element was carried out to acquire the element maps thereof for both the five visual fields according to the energy dispersive X-ray analysis method. It was determined that the active metal nitride layer was present in a case where the active metal element and N were present in the same region.

The observation was carried out in both the five visual fields, that is, a total of ten visual fields, and the average value obtained by dividing the area in which the active metal element and N were present in the same region by the measured width was defined as the "thickness of the active metal nitride layer".

(Ag—Cu Alloy Layer)

In cross sections of the bonded interface between the circuit layer and the ceramic substrate and the bonded interface between the ceramic substrate and the metal layer, element mapping of Ag, Cu, and the active metal was carried out to acquire the element maps thereof by using an EPMA device. Element mapping was carried out to acquire the element map of each element in both the five visual fields.

Then, a region in which the Ag concentration was 15% by mass or more was defined as the Ag—Cu alloy layer in a case where Ag+Cu+active metal was set to 100% by mass, and an area thereof was measured to determine a value obtained by dividing the area by a width of the measurement region (area/width of measurement region). The average of the values is shown in Table 2 as the thickness of the Ag—Cu alloy layer.

(Thermal Cycle Reliability)

The above-described insulating circuit substrate was loaded with a thermal cycle of 40° C.×5 min← →150° C.×5 min, an SAT examination (ultrasonic examination) was carried out every 100 cycles up to 2000 cycles to check the presence or absence of ceramic breaking, and the number of cycles leading to ceramic breaking was evaluated. The evaluation results are shown in Table 2.

TABLE 1

| | | Bonding material in peripheral part of copper sheet | | | | | | Bonding material in central part of copper sheet | | | | |
|---|---|---|---|---|---|---|---|---|---|---|---|---|
| | | | Cu | Active element | | BET value of Ag | Coating thick- | | Cu | Active element | | BET value of Ag | Coating thick- |
| | | Ag | mass % | Element | mass % | powder m²/g | ness μm | Ag | mass % | Element | mass % | powder m²/g | ness μm |
| Invention Example | 1 | Balance | — | Ti | 2.1 | 0.56 | 35 | Balance | 24.5 | Ti | 3.5 | 1.03 | 45 |
| | 2 | Balance | 42.7 | Ti | 0.8 | 0.16 | 10 | Balance | — | Ti | 8.3 | 15.00 | 25 |
| | 3 | Balance | — | Ti | 2.3 | 1.03 | 20 | Balance | — | Zr | 5.7 | 0.56 | 30 |
| | 4 | Balance | — | Zr | 1.5 | 0.16 | 10 | Balance | — | Zr | 5.7 | 1.03 | 15 |
| | 5 | Balance | 29.0 | Nb | 1.0 | 0.22 | 15 | Balance | — | Ti | 4.5 | 0.56 | 30 |
| | 6 | Balance | — | Hf | 4.5 | 1.38 | 10 | Balance | — | Hf | 4.5 | 1.38 | 25 |
| | 7 | Balance | — | Zr | 2.6 | 0.56 | 10 | Balance | 26.5 | Zr | 2.5 | 0.22 | 30 |
| | 8 | Balance | 34.5 | Ti | 0.5 | 0.22 | 15 | Balance | 26.5 | Ti | 1.5 | 0.22 | 35 |
| Comparative Example | 1 | Balance | — | Zr | 5.7 | 0.44 | 35 | Balance | — | Zr | 5.7 | 0.16 | 45 |
| | 2 | Balance | — | Zr | 3.3 | 0.16 | 15 | Balance | — | Zr | 5.7 | 1.38 | 45 |
| | 3 | Balance | 34.5 | Ti | 2.5 | 0.56 | 40 | Balance | — | Ti | 4.5 | 1.03 | 35 |

TABLE 2

| | | Pressurizing and heating step | Active metal compound Area rate (%) | | | Active metal nitride layer Thickness (μm) | | | Ag—Cu alloy layer Thickness (μm) | | | Thermal cycle reliability |
|---|---|---|---|---|---|---|---|---|---|---|---|---|
| | | Temperature integral value °C.·h | Peripheral part region $P_A$ | Central part region $P_B$ | $P_A/P_B$ | Peripheral part region $t1_A$ | Central part region $t1_B$ | $t1_A/t1_B$ | Peripheral part region $t2_A$ | Central part region $t2_B$ | $t2_A/t2_B$ | Breaking occurrence (number of cycles) |
| Invention Example | 1 | 119.4 | 10 | 8 | 1.3 | 0.79 | 0.67 | 1.18 | 28 | 22 | 1.27 | 1600th |
| | 2 | 21.5 | 2 | 3 | 0.7 | 0.13 | 0.17 | 0.76 | 8 | 10 | 0.80 | 1600th |
| | 3 | 96.0 | 8 | 6 | 1.4 | 0.62 | 0.45 | 1.38 | 18 | 13 | 1.38 | 1500th |
| | 4 | 7.5 | 2 | 2 | 0.9 | 0.07 | 0.09 | 0.75 | 3 | 4 | 0.75 | 1800th |
| | 5 | 98.7 | 8 | 6 | 1.2 | 0.44 | 0.41 | 1.08 | 11 | 9 | 1.22 | 1900th |
| | 6 | 32.5 | 4 | 3 | 1.1 | 0.30 | 0.29 | 1.03 | 13 | 12 | 1.08 | >2000th |
| | 7 | 61.2 | 6 | 6 | 0.9 | 0.39 | 0.43 | 0.91 | 5 | 7 | 0.71 | 2000th |
| | 8 | 18.4 | 3 | 3 | 1.1 | 0.25 | 0.23 | 1.09 | 17 | 16 | 1.06 | >2000th |
| Comparative Example | 1 | 148.2 | 15 | 13 | 1.1 | 1.19 | 1.16 | 1.02 | 24 | 20 | 1.20 | 1100th |
| | 2 | 59.7 | 6 | 9 | 0.6 | 0.47 | 0.59 | 0.79 | 14 | 18 | 0.78 | 1300th |
| | 3 | 51.4 | 8 | 5 | 1.5 | 0.53 | 0.34 | 1.53 | 21 | 13 | 1.62 | 1200th |

In Comparative Example 1, in a region extending by 10 μm from the active metal nitride layer toward a side of the copper sheet, an area rate of an active metal compound containing Si and an active metal was more than 10%, and in the thermal cycle test, the number of cycles leading to breaking occurrence was 1100 cycles.

In Comparative Example 2, a ratio $P_A/P_B$ of an area rate $P_A$ of the active metal compound in a peripheral part region of the copper sheet to an area rate $P_B$ of the active metal compound in a central part region of the copper sheet was 0.6, and in the thermal cycle test, the number of cycles leading to breaking occurrence was 1300 cycles.

In Comparative Example 3, a ratio $P_A/P_B$ of an area rate $P_A$ of the active metal compound in a peripheral part region of the copper sheet to an area rate $P_B$ of the active metal compound in a central part region of the copper sheet was 1.5, and in the thermal cycle test, the number of cycles leading to breaking occurrence was 1200 cycles.

On the other hand, in Invention Examples 1 to 8, in a region extending by 10 μm from the active metal nitride layer toward a side of the copper sheet, an area rate of an active metal compound containing Si and an active metal was 10% or less, and concurrently, a ratio $P_A/P_B$ of an area rate $P_A$ of the active metal compound in a peripheral part region of the copper sheet to an area rate $P_B$ of the active metal compound in a central part region of the copper sheet was 0.7 or more and 1.4 or less, and in the thermal cycle test, the number of cycles leading to breaking occurrence was 1500 to more than 2000 cycles, and the thermal cycle reliability was excellent.

From the results of the above-described checking experiments, according to Invention Examples, it has been confirmed that it is possible to provide an insulating circuit substrate (a copper/ceramic assembly) having an excellent thermal cycle reliability, which can suppress the occurrence of breaking in a ceramic member even in a case where a severe thermal cycle is loaded.

INDUSTRIAL APPLICABILITY

The copper/ceramic assembly and the insulating circuit substrate according to the present embodiment are suitably applied to power modules, LED modules, and thermoelectric modules.

REFERENCE SIGNS LIST

10: Insulating circuit substrate (copper/ceramic assembly)
11: Ceramic substrate (ceramic member)
12: Circuit layer (copper member)
13: Metal layer (copper member)
21 (21A, 21B): Active metal nitride layer
22 (22A, 22B): Ag—Cu alloy layer

What is claimed is:

1. A copper/ceramic assembly obtained by bonding a copper member consisting of copper or a copper alloy and a ceramic member consisting of silicon nitride,
    wherein at a bonded interface between the ceramic member and the copper member, an active metal nitride layer is formed on a side of the ceramic member,
    in a region extending by 10 μm from the active metal nitride layer toward a side of the copper member, an area rate of an active metal compound containing Si and an active metal is 10% or less, and
    a ratio $P_A/P_B$ of an area rate $P_A$ of the active metal compound in a peripheral part region of the copper member to an area rate $P_B$ of the active metal compound in a central part region of the copper member is in a range of 0.7 or more and 1.4 or less.

2. The copper/ceramic assembly according to claim 1, wherein a thickness $t1_A$ of the active metal nitride layer formed in the peripheral part region of the copper member and a thickness $t1_B$ of the active metal nitride layer formed in the central part region of the copper member are in a range of 0.05 μm or more and 0.8 μm or less, and a thickness ratio $t1_A/t1_B$ is in a range of 0.7 or more and 1.4 or less.

3. The copper/ceramic assembly according to claim 1, wherein at the bonded interface between the ceramic member and the copper member, an Ag—Cu alloy layer is formed on the side of the copper member, and a thickness $t2_A$ of the Ag—Cu alloy layer formed in the peripheral part region of the copper member and a thickness $t2_B$ of the Ag—Cu alloy layer formed in the central part region of the copper member are in a range of 1 μm or more and 30 μm or less, and a thickness ratio $t2_A/t2_B$ is in a range of 0.7 or more and 1.4 or less.

4. The copper/ceramic assembly according to claim 2, wherein at the bonded interface between the ceramic member and the copper member, an Ag—Cu alloy layer is formed on the side of the copper member, and a thickness $t2_A$ of the Ag—Cu alloy layer formed in the peripheral part region of the copper member and a thickness $t2_B$ of the Ag—Cu alloy layer formed in the central part region of the copper member are in a range of 1 μm or more and 30 μm or less, and a thickness ratio $t2_A/t2_B$ is in a range of 0.7 or more and 1.4 or less.

5. An insulating circuit substrate obtained by bonding a copper sheet consisting of copper or a copper alloy to a surface of a ceramic substrate consisting of silicon nitride,
    wherein at a bonded interface between the ceramic substrate and the copper sheet, an active metal nitride layer is formed on a side of the ceramic substrate,
    in a region extending by 10 μm from the active metal nitride layer toward a side of the copper sheet, an area rate of an active metal compound containing Si and an active metal is 10% or less, and
    a ratio $P_A/P_B$ of an area rate $P_A$ of the active metal compound in a peripheral part region of the copper sheet to an area rate $P_B$ of the active metal compound in a central part region of the copper sheet is in a range of 0.7 or more and 1.4 or less.

6. The insulating circuit substrate according to claim 5, wherein a thickness $t1_A$ of the active metal nitride layer formed in the peripheral part region of the copper sheet and a thickness $t1_B$ of the active metal nitride layer formed in the central part region of the copper sheet are in a range of 0.05 μm or more and 0.8 μm or less, and a thickness ratio $t1_A/t1_B$ is in a range of 0.7 or more and 1.4 or less.

7. The insulating circuit substrate according to claim 5, wherein at the bonded interface between the ceramic substrate and the copper sheet, an Ag—Cu alloy layer is formed on the side of the copper sheet, and a thickness $t2_A$ of the Ag—Cu alloy layer formed in the peripheral part region of the copper sheet and a thickness $t2_B$ of the Ag—Cu alloy layer formed in the central part region of the copper sheet are in a range of 1 μm or more and 30 μm or less, and a thickness ratio $t2_A/t2_B$ is in a range of 0.7 or more and 1.4 or less.

8. The insulating circuit substrate according to claim 6, wherein at the bonded interface between the ceramic substrate and the copper sheet, an Ag—Cu alloy layer is formed on the side of the copper sheet, and a thickness $t2_A$ of the Ag—Cu alloy layer formed in the peripheral part region of the copper sheet and a thickness $t2_B$ of the Ag—Cu alloy layer formed in the central part region of the copper sheet are in a range of 1 μm or more and 30 μm or less, and a thickness ratio $t2_A/t2_B$ is in a range of 0.7 or more and 1.4 or less.

* * * * *